United States Patent
Cao et al.

(10) Patent No.: US 11,281,055 B2
(45) Date of Patent: Mar. 22, 2022

(54) ARRAY SUBSTRATE AND DISPLAY PANEL

(71) Applicant: Shenzhen China Star Optoelectronics Semiconductor Display Technology Co., Ltd., Shenzhen (CN)

(72) Inventors: Wu Cao, Shenzhen (CN); Qi Zhang, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 198 days.

(21) Appl. No.: 16/627,349

(22) PCT Filed: Dec. 20, 2019

(86) PCT No.: PCT/CN2019/126838
§ 371 (c)(1),
(2) Date: Dec. 30, 2019

(87) PCT Pub. No.: WO2021/114364
PCT Pub. Date: Jun. 17, 2021

(65) Prior Publication Data
US 2021/0333650 A1 Oct. 28, 2021

(30) Foreign Application Priority Data
Dec. 12, 2019 (CN) .......................... 201911271052.1

(51) Int. Cl.
G02F 1/1343 (2006.01)
G02F 1/1362 (2006.01)
H01L 27/12 (2006.01)
G02F 1/1335 (2006.01)

(52) U.S. Cl.
CPC .. G02F 1/134309 (2013.01); G02F 1/136286 (2013.01); H01L 27/1244 (2013.01); *G02F 1/133514* (2013.01)

(58) Field of Classification Search
None
See application file for complete search history.

(56) References Cited

U.S. PATENT DOCUMENTS

2018/0129110 A1* 5/2018 Syn ................... G02F 1/136213

* cited by examiner

*Primary Examiner* — James A Dudek

(57) ABSTRACT

The present invention discloses an array substrate and a display panel. The array substrate includes an underlay substrate, scan lines disposed transversely, data lines disposed longitudinally, and a plurality of pixel units. Each pixel unit has a primary region and a secondary region. The pixel unit has a primary pixel electrode in the primary region and a secondary pixel electrode in the secondary region. The primary pixel electrode and the secondary pixel electrode are disposed at an interval, and the secondary pixel electrode surrounds a portion of the primary pixel electrode near the data lines.

14 Claims, 8 Drawing Sheets

ARRAY SUBSTRATE AND DISPLAY PANEL

RELATED APPLICATIONS

This application is a National Phase of PCT Patent Application No. PCT/CN2019/126838 having International filing date of Dec. 20, 2019, which claims the benefit of priority of Chinese Patent Application No. 201911271052.1 filed on Dec. 12, 2019. The contents of the above applications are all incorporated by reference as if fully set forth herein in their entirety.

FIELD AND BACKGROUND OF THE INVENTION

The present invention relates to a field of display technologies, especially relates to an array substrate and a display panel.

A general VA type liquid crystal display panel, to present a better experience of an angle of view, with reference to FIG. 1, generally a design of four domains in one pixel unit is changed to a design of eight domains. By disposing primary domains 11 and secondary domains 12 with voltage difference. Each of the primary domains 11 and the secondary domains 12 comprises axisymmetric four domains. Difference between a front view and a side view is reduced by orientation differentiation of space and liquid crystal such that a characteristic of color cast of view is improved. In the liquid crystal display panel of eight domains, to mask coupling capacitors formed among data lines 13 and PE electrodes 14 of the primary domains 11 to prevent poor display due to voltage variation, usually a metal mask layer 15 is disposed around the PE electrodes 14 of the primary domains 11.

However, the metal mask layer 15 is usually made of an opaque material, which causes decrease of an aperture ratio of the display panel.

SUMMARY OF THE INVENTION

Technical Issue

The present invention provides an array substrate to solve the technical issue that generally a metal mask layer is formed by an opaque material to result in decrease of an aperture ratio of the display panel.

Technical Solution

In a first aspect, the present invention provides an array substrate, comprising:
an underlay substrate;
a plurality of scan lines disposed transversely on the underlay substrate and arranged abreast;
a plurality of data lines disposed longitudinally on the underlay substrate and arranged abreast; and
a plurality of pixel units disposed on the underlay substrate and distributed in an array, each of the scan lines corresponding to a row of the pixel units, each of the data lines corresponding to a column of the pixel units, and adjacent two of the data lines defining a boundary of the pixel units;
wherein each of the pixel units comprises a primary region and a secondary region, the pixel unit comprises a primary pixel electrode located in the primary region and a secondary pixel electrode located in the secondary region, the primary pixel electrode and the secondary pixel electrode are disposed at an interval, the secondary pixel electrode surrounds a portion of the primary pixel electrode near the data lines.

In some embodiments, the primary pixel electrode comprises a primary electrode, the primary electrode defines a zone in which the primary pixel electrode is located as a plurality of primary domains, a branching electrode is disposed in each of the primary domains and is connected electrically to the primary electrode; the secondary pixel electrode comprises a electrode trunk, the electrode trunk defines a zone in which the secondary pixel electrode is located as a plurality of secondary domains, an electrode branch is disposed in each of the secondary domains and is connected electrically to the electrode trunk.

In some embodiments, the secondary pixel electrode comprises a first splitting body and two second splitting bodies disposed respectively on two sides of the first splitting body near the data lines, and the second splitting bodies extend along a length direction of the data lines; a mask area is defined among the first splitting body and the second splitting bodies, and the secondary pixel electrode is located in the mask area.

In some embodiments, the primary pixel electrode comprises a first primary electrode and two branch portions disposed at an interval, the first primary electrode defines a zone in which each of the branch portions is located as two first primary domains, and a first branching electrode is disposed in each of the first primary domains and is connected electrically to the first primary electrode.

In some embodiments, the first splitting body comprises two first electrode trunks intersecting each other, the first primary electrode defines a zone in which the first splitting body is located as four first secondary domains, and a first branching electrode is disposed in each of the first primary domains and is connected electrically to the first primary electrode.

In some embodiments, the second splitting bodies comprise two splitting electrodes disposed respectively on two opposite sides of the primary pixel electrode, each of the splitting electrodes comprises a second electrode trunk defining a zone in which the splitting electrodes are located as two second secondary domains, and a second electrode branch is disposed in each of the second secondary domains and is connected electrically to the second electrode trunk.

In some embodiments, the primary pixel electrode comprises two second primary electrodes intersecting each other, the second primary electrodes defines the zone in which the primary pixel electrode is located as four second primary domains, and a second branching electrode is disposed in each of the second primary domains and is connected electrically to the second primary electrodes.

In some embodiments, the primary pixel electrode comprises two third primary electrodes intersecting each other, the third primary electrodes define the zone in which the primary pixel electrode is located as four third primary domains; the secondary pixel electrode comprises two splitting bodies located respectively on two sides of the primary pixel electrode near the data lines, and each of the splitting bodies comprises a third electrode trunk defining the splitting bodies as two third secondary domains.

In some embodiments, the two splitting bodies are disposed at an interval.

In some embodiments, the two splitting bodies are connected to each other, the secondary pixel electrode is a closed loop as a whole, and the primary pixel electrode is located in the closed loop defined by the secondary pixel electrode.

In some embodiments, the data lines comprises a first side disposed near the secondary pixel electrode, an orthographic projection of the secondary pixel electrode on the underlay substrate covers an orthographic projection of the first side on the underlay substrate.

In some embodiments, the array substrate further comprises a common electrode disposed in a same layer with the scan lines, an orthographic projection of the branching electrode and the electrode branch on the underlay substrate does not coincide with an orthographic projection of the common electrode on the underlay substrate.

In some embodiments, the branching electrode is disposed obliquely, and an edge line of the branching electrode and an edge line of the primary electrode form a first included angle; the electrode branch is disposed obliquely, and an edge line of the electrode branch and an edge line of the electrode trunk form a second included angle, and each of the first included angle and the second included angle is 10-80 degrees.

In a second aspect, the present invention also provides a display panel, comprising a color filter substrate and an array substrate, a liquid crystal layer is disposed between the color filter substrate and the array substrate, and the array substrate comprises:

an underlay substrate;

a plurality of scan lines disposed transversely on the underlay substrate and arranged abreast;

a plurality of data lines disposed longitudinally on the underlay substrate and arranged abreast; and a plurality of pixel units disposed on the underlay substrate and distributed in an array, each of the scan lines corresponding to a row of the pixel units, each of the data lines corresponding to a column of the pixel units, and adjacent two of the data lines defining a boundary of the pixel units;

wherein each of the pixel units comprises a primary region and a secondary region, the pixel unit comprises a primary pixel electrode located in the primary region and a secondary pixel electrode located in the secondary region, the primary pixel electrode and the secondary pixel electrode are disposed at an interval, the secondary pixel electrode surrounds a portion of the primary pixel electrode near the data lines.

In some embodiments, the primary pixel electrode comprises a primary electrode, the primary electrode defines a zone in which the primary pixel electrode is located as a plurality of primary domains, a branching electrode is disposed in each of the primary domains and is connected electrically to the primary electrode; the secondary pixel electrode comprises a electrode trunk, the electrode trunk defines a zone in which the secondary pixel electrode is located as a plurality of secondary domains, an electrode branch is disposed in each of the secondary domains and is connected electrically to the electrode trunk.

In some embodiments, the secondary pixel electrode comprises a first splitting body and two second splitting bodies disposed respectively on two sides of the first splitting body near the data lines, and the second splitting bodies extend along a length direction of the data lines; a mask area is defined among the first splitting body and the second splitting bodies, and the secondary pixel electrode is located in the mask area.

In some embodiments, the primary pixel electrode comprises a first primary electrode and two branch portions disposed at an interval, the first primary electrode defines a zone in which each of the branch portions is located as two first primary domains, and a first branching electrode is disposed in each of the first primary domains and is connected electrically to the first primary electrode.

In some embodiments, the first splitting body comprises two first electrode trunks intersecting each other, the first primary electrode defines a zone in which the first splitting body is located as four first secondary domains, and a first branching electrode is disposed in each of the first primary domains and is connected electrically to the first primary electrode.

In some embodiments, the second splitting bodies comprise two splitting electrodes disposed respectively on two opposite sides of the primary pixel electrode, each of the splitting electrodes comprises a second electrode trunk defining a zone in which the splitting electrodes are located as two second secondary domains, and a second electrode branch is disposed in each of the second secondary domains and is connected electrically to the second electrode trunk.

In some embodiments, the primary pixel electrode comprises two second primary electrodes intersecting each other, the second primary electrodes defines the zone in which the primary pixel electrode is located as four second primary domains, and a second branching electrode is disposed in each of the second primary domains and is connected electrically to the second primary electrodes.

Advantages

Compared to the prior art, the present invention provides the physical keyboard input system and physical keyboard inputting method thereof, the physical keyboard input system comprises a mobile terminal and physical keyboard, the physical keyboard covers a touch screen of the mobile terminal, and is configured to convert a first touch information applied by a user to a key into a second touch information of the touch screen. The mobile terminal comprising a detecting device, a touch screen, a touch screen control chip and a processor. The detecting device, the touch screen and the touch screen control chip are connected simultaneously to the processor. The present invention by directly covering the touch screen of the mobile terminal with the physical keyboard, achieves an objective of text information input by physical keys, and the physical keyboard no longer requires power connection for driving, which achieves an effect of instant plug and play and lowers a cost and power consumption of the mobile terminal.

Figure 1:
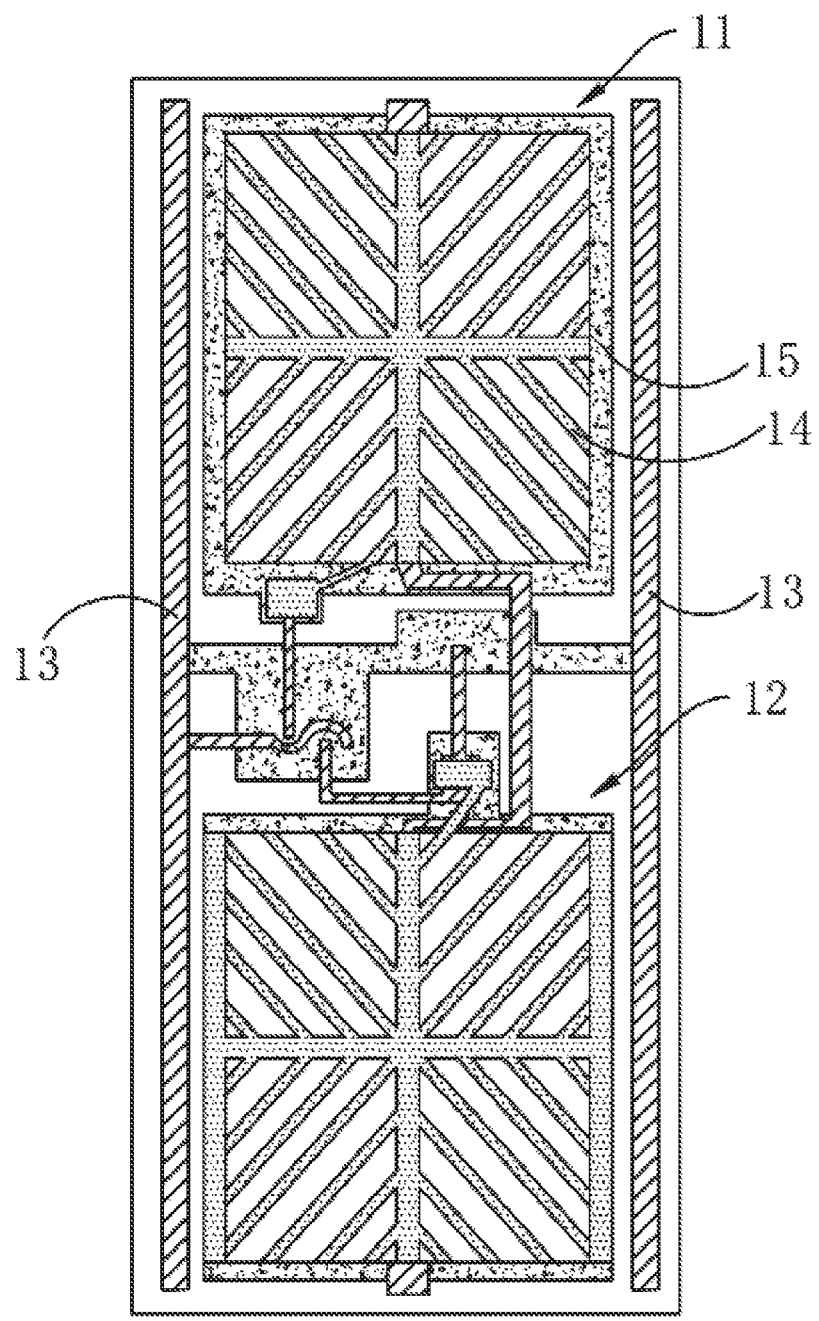
FIG. 1 is a schematic structural view of a conventional liquid crystal display panel.

REFERENCE CHARACTERS 11, primary domains; 12, secondary domains; 13, Data line; 14, PE electrode; 15, metal mask layer;

20, array substrate; 21, underlay substrate; 22, scan lines; 23, data lines; 231, first side;
24, primary region;
25, secondary region;
26, primary pixel electrode; 261, first primary electrode; 262, first branching electrode; 263, second primary electrodes; 264, second branching electrode; 265, third primary electrodes; 266, third branching electrode;
27, secondary pixel electrode; 271, first splitting body; 2711, first electrode trunk; 2712, first electrode branch; 272, second splitting body; 2721, second electrode trunk; 2722, second electrode branch; 273, third electrode trunk;
28, common electrode; 29, source and drain electrode; 30, color filter substrate; 40, liquid crystal layer.

DESCRIPTION OF SPECIFIC EMBODIMENTS OF THE INVENTION

The technical solution in the embodiment of the present invention will be clearly and completely described below with reference to the accompanying drawings in the embodiments of the present invention. Apparently, the described embodiments are merely some embodiments of the present invention instead of all embodiments. According to the embodiments in the present invention, all other embodiments obtained by those skilled in the art without making any creative effort shall fall within the protection scope of the present invention.

The present invention aims at the technical issue that in a conventional array substrate, to mask a coupling capacitor formed among data lines and pixel electrode in primary domains, metal mask layer is usually made of an opaque material and results in a lowered aperture ratio of the display panel. The present invention to solve the above issue.

Figure 2:
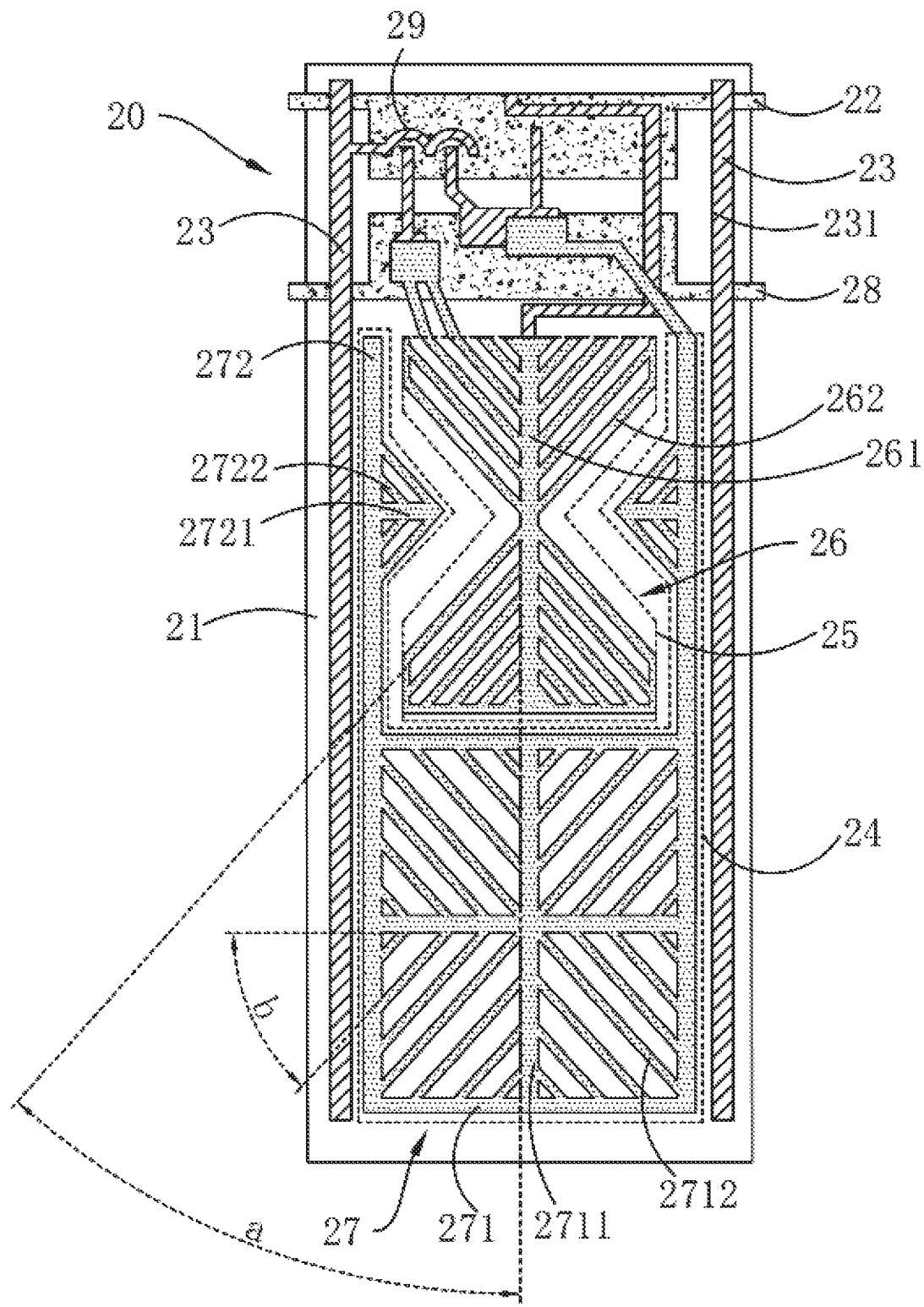
FIG. 2 is a schematic structural view of the array substrate of a first embodiment of the present invention.

An array substrate 20, with reference to FIG. 2, the array substrate 20 comprises an underlay substrate 21, a plurality of scan lines 22 disposed transversely on the underlay substrate 21 and arranged abreast, a plurality of data lines 23 disposed longitudinally on the underlay substrate 21 and arranged abreast, and a plurality of pixel units disposed on the underlay substrate 21 and distributed in an array.

Each of the scan lines 22 corresponds to a row of the pixel units. Each of the data lines 23 corresponds to a column of the pixel units. Adjacent two of the data lines 23 defines a boundary of the pixel units.

Specifically, each of the pixel units comprises a primary region 24 and a secondary region 25, the pixel unit comprises a primary pixel electrode 26 in the primary region 24 and a secondary pixel electrode 27 in the secondary region 25. The primary pixel electrode 26 and the secondary pixel electrode 27 are disposed at an interval. the secondary pixel electrode 27 surrounds a portion of the primary pixel electrode 26 near the data lines 23.

By a design of the secondary pixel electrode 27 surrounding the portion of the primary pixel electrode 26 near the data lines 23, the secondary pixel electrode 27 is used to isolate interference between the primary pixel electrode 26 and the data lines 23 and prevent coupling capacitors from being formed among the data lines 23 and the primary pixel electrode 26. Therefore, the design of a metal mask layer can be cancelled under a precondition of prevention of crosstalk issue such that an aperture ratio and a transmittance of the array substrate 20 can be improved drastically.

Specifically, the data lines 23 comprises a first side 231 disposed near the secondary pixel electrode 27. an orthographic projection of the secondary pixel electrode 27 on the underlay substrate 21 covers an orthographic projection of the first side 231 on the underlay substrate 21.

It should be understood that for a person of ordinary skill in the art, a general array substrate 20 disposes a light shielding layer above the data lines 23 for replacement of a light shielding function of the black matrix, by overlapping the secondary pixel electrode 27 and the first side 231 of a corresponding one of the data lines 23, a masking function is performed better while the data lines 23 can be used for light shielding. Furthermore, by using the secondary pixel electrode 27 to shield light for the edge of the data lines 23, a design of a light shielding layer can be cancelled to reduce processes and enhance the aperture ratio of the array substrate 20.

In an embodiment, an overlapping between the secondary pixel electrode 27 and the data lines 23 has a width of 0.5-3 microns.

Specifically, the primary pixel electrode 26 comprises a primary electrode. The primary electrode defines a zone in which the primary pixel electrode 26 is located as a plurality of primary domains. A branching electrode is disposed in each of the primary domains and is connected electrically to the primary electrode.

Specifically, the secondary pixel electrode 27 comprises a electrode trunk. The electrode trunk defines a zone in which the secondary pixel electrode 27 is located as a plurality of secondary domains. An electrode branch is disposed in each of the secondary domains and is connected electrically to the electrode trunk.

Specifically, the array substrate 20 further comprises a common electrode 28 disposed in a same layer with the scan lines 22 and a source and drain electrode 29 disposed in a same layer with the data lines 23. The source and drain electrode 29 is connected electrically to the data lines 23, the primary pixel electrode 26, and the secondary pixel electrode 27 to transfer data signals of the data lines 23 to the primary pixel electrode 26 and the secondary pixel electrode 27.

An orthographic projection of the branching electrode and the electrode branch on the underlay substrate 21 does not coincides with an orthographic projection of the common electrode 28 on the underlay substrate 21 to prevent the common electrode 28 from causing decrease of the aperture ratio of the array substrate 20.

The branching electrode is disposed obliquely, and an edge line of the branching electrode and an edge line of the primary electrode form a first included angle a. The electrode branch is disposed obliquely, and an edge line of the electrode branch and an edge line of the electrode trunk form a second included angle b. each of the first included angle a and the second included angle b is 10-80 degrees.

Furthermore, each of the first included angle a and the second included angle b is 20-70 degrees.

By adjustment of orientations of the electrode branches and the branching electrodes, intervals among the electrode branches and intervals among the branching electrode can be adjusted such that transmittances of the primary region 24 and secondary region 25 can be adjusted.

Figure 3:
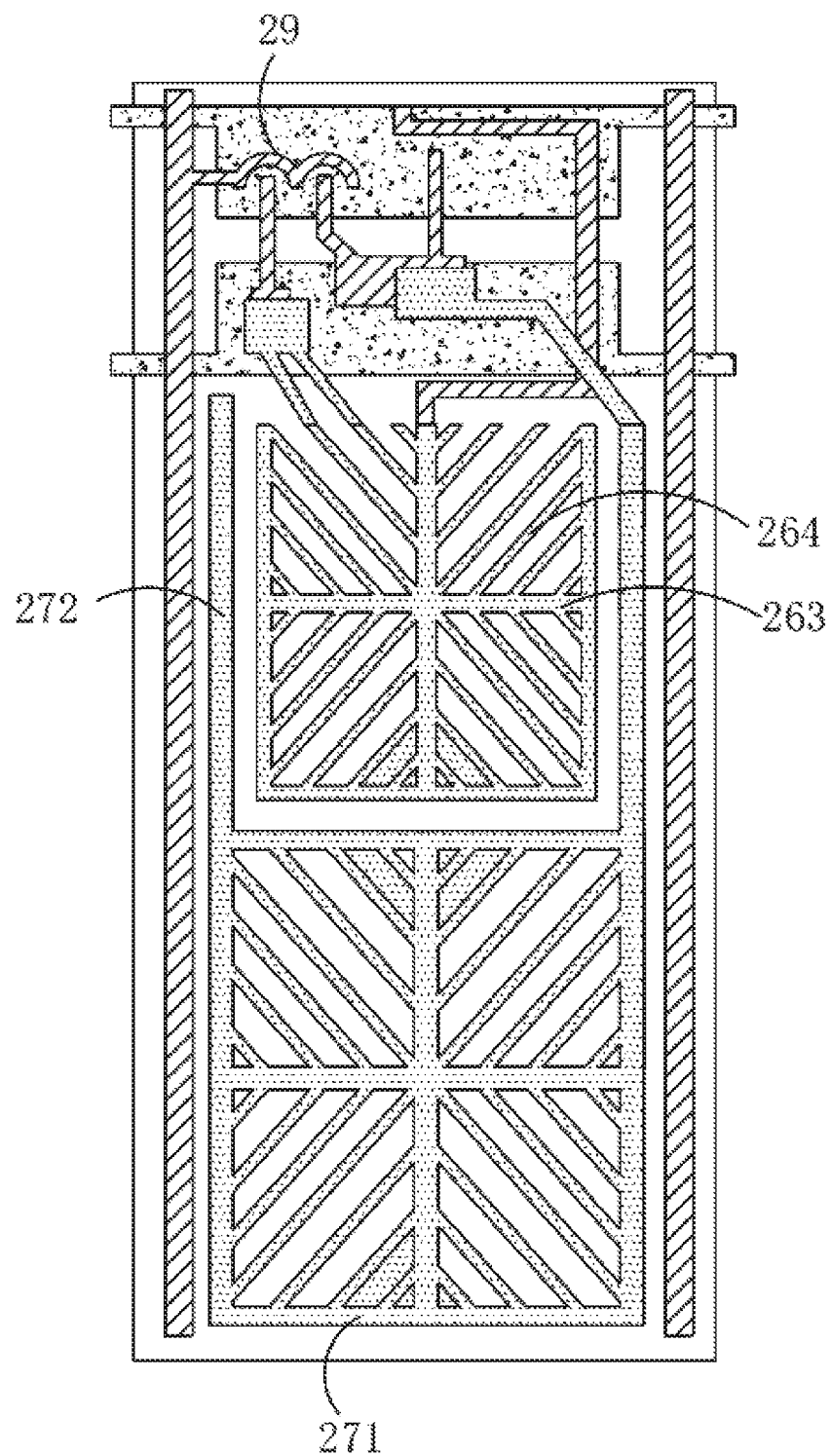
FIG. 3 is a schematic structural view of the array substrate of a second embodiment of the present invention.

With reference to FIGS. 2 and 3, the secondary pixel electrode 27 comprises a first splitting body 271 and two second splitting bodies 272 disposed respectively on two sides of the first splitting body 271 near the data lines 23. The second splitting bodies 272 extends along a length direction of the data lines 23. A mask area is formed among the first splitting body 271 the second splitting bodies 272, and the secondary pixel electrode 27 is located in the mask area.

It should be understood that the first splitting body 271, the second splitting bodies 272, and the primary pixel electrode 26 can all be made in the same process.

In a first embodiment, with reference to FIG. 2, a zone in which the primary pixel electrode 26 is located comprises four primary domains, and the secondary pixel electrode 27 comprises eight secondary domains.

Specifically, the primary pixel electrode 26 comprises a first primary electrode 261 and two branch portions disposed at an interval. The first primary electrode 261 defines a zone in which each of the branch portions is located as two first primary domains. A first branching electrode 262 is disposed in each of the first primary domains and is connected electrically to the first primary electrode 261.

It should be understood that FIG. 2 only illustrates the condition of the first primary electrode 261 disposed longitudinally and the two branch portions arranged transversely. In an actual implementation, the first primary electrode 261 can disposed transversely, and the two branch portions can be arranged longitudinally.

Specifically, the first splitting body 271 comprises two first electrode trunks 2711 intersecting each other. The first primary electrode 261 defines a zone in which the first splitting body 271 is located as four first secondary domains, and a first electrode branch 2712 is disposed in each of the first secondary domains and is connected electrically to the first electrode trunk 2711.

Furthermore, the second splitting bodies 272 comprises two splitting electrodes located respectively on two opposite sides of the primary pixel electrode 26, and each of the splitting electrodes comprises a second electrode trunk 2721 defining a zone in which the splitting electrodes are located as two second secondary domains. A second electrode branch 2722 is disposed in each of the second secondary domains and is connected electrically to the second electrode trunk 2721.

In a second embodiment, with reference to FIG. 3, a zone in which the primary pixel electrode 26 is located comprises four primary domains, and the secondary pixel electrode 27 comprises four secondary domains.

Specifically, the primary pixel electrode 26 comprises two second primary electrodes 263 intersecting each other, and the second primary electrodes 263 intersecting each other form a cross structure; the second primary electrodes 263 defines the zone in which the primary pixel electrode 26 is located as four second primary domains, and a second branching electrode 264 is disposed in each of the second primary domains and is connected electrically to the second primary electrodes 263.

Specifically, the second splitting bodies 272 of the secondary pixel electrode 27 are formed from extension of two side edges of the first splitting body 271 along data lines 23.

Figure 4:
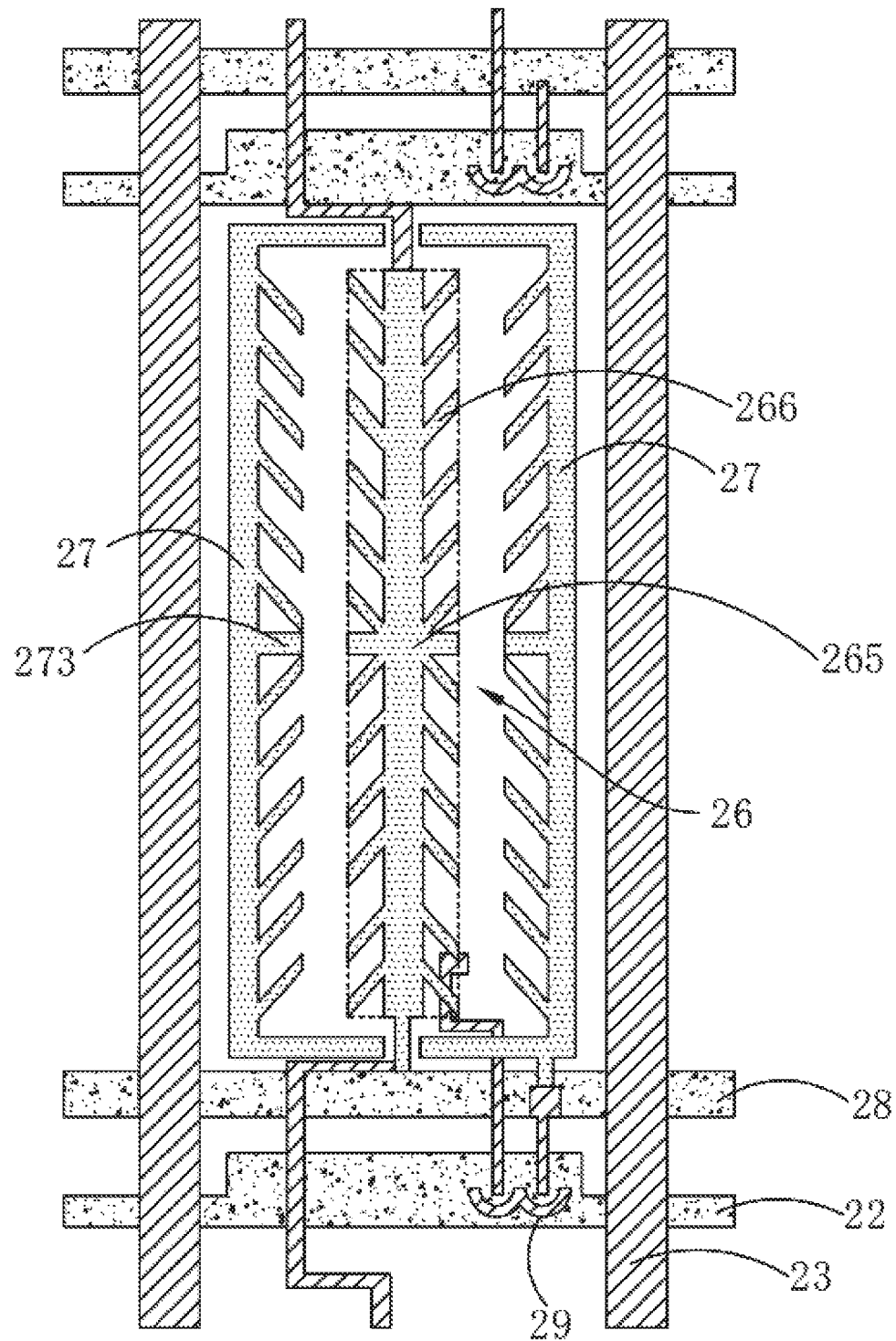
FIGS. 4 and 5 are schematic structural views of the array substrate of a third embodiment of the present invention.
Figure 7:
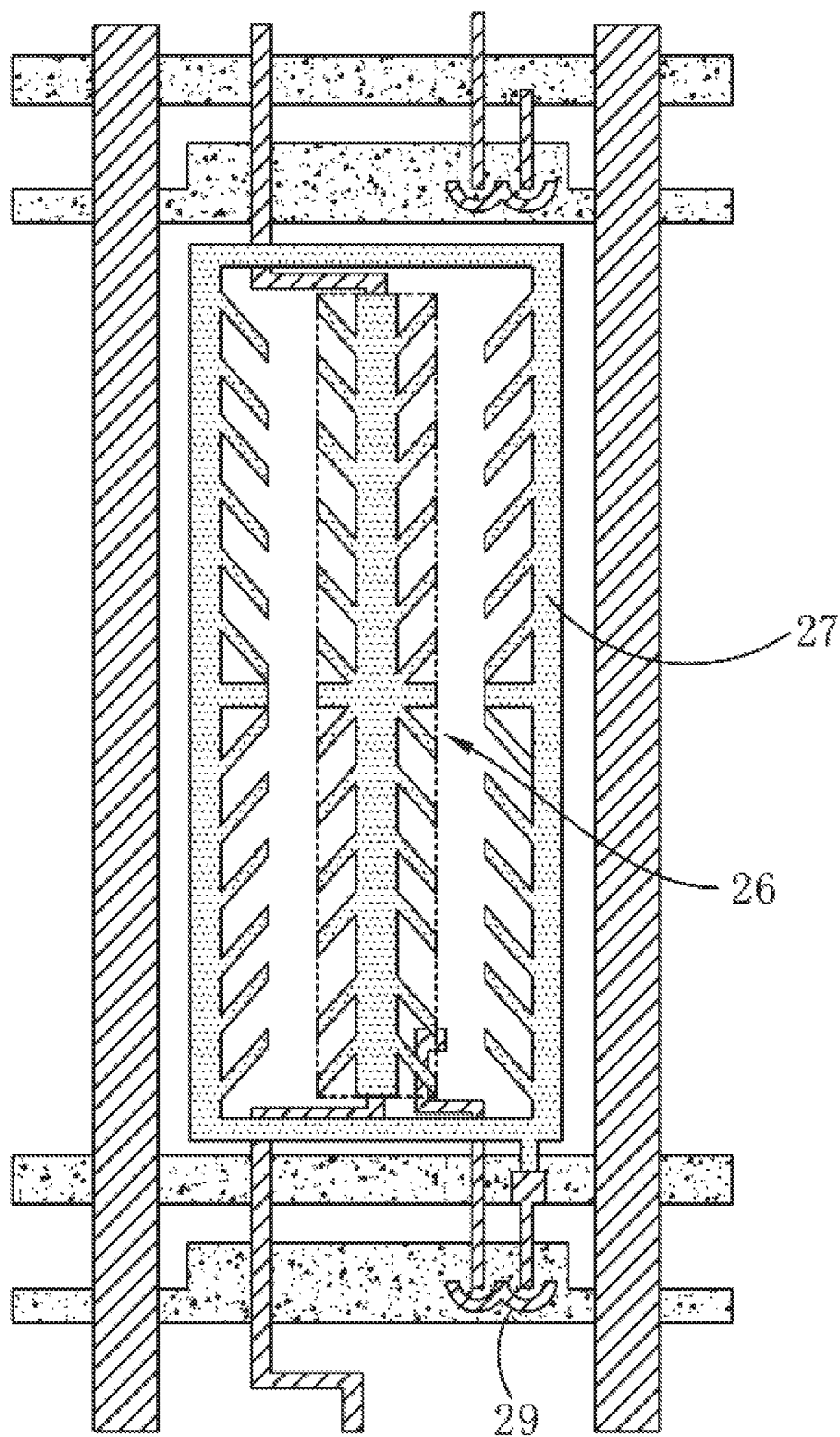

In an embodiment, with reference to FIGS. 4 and 7, the primary pixel electrode 26 comprises two third primary electrodes 265 intersecting each other, the third primary electrodes 265 defines a zone in which the primary pixel electrode 26 is located as four third primary domains. The secondary pixel electrode 27 two splitting bodies located respectively on two sides of the primary pixel electrode 26 near the data lines 23, and each of the splitting bodies comprises a third electrode trunk defining the splitting bodies as two third secondary domains 273.

Figure 5:
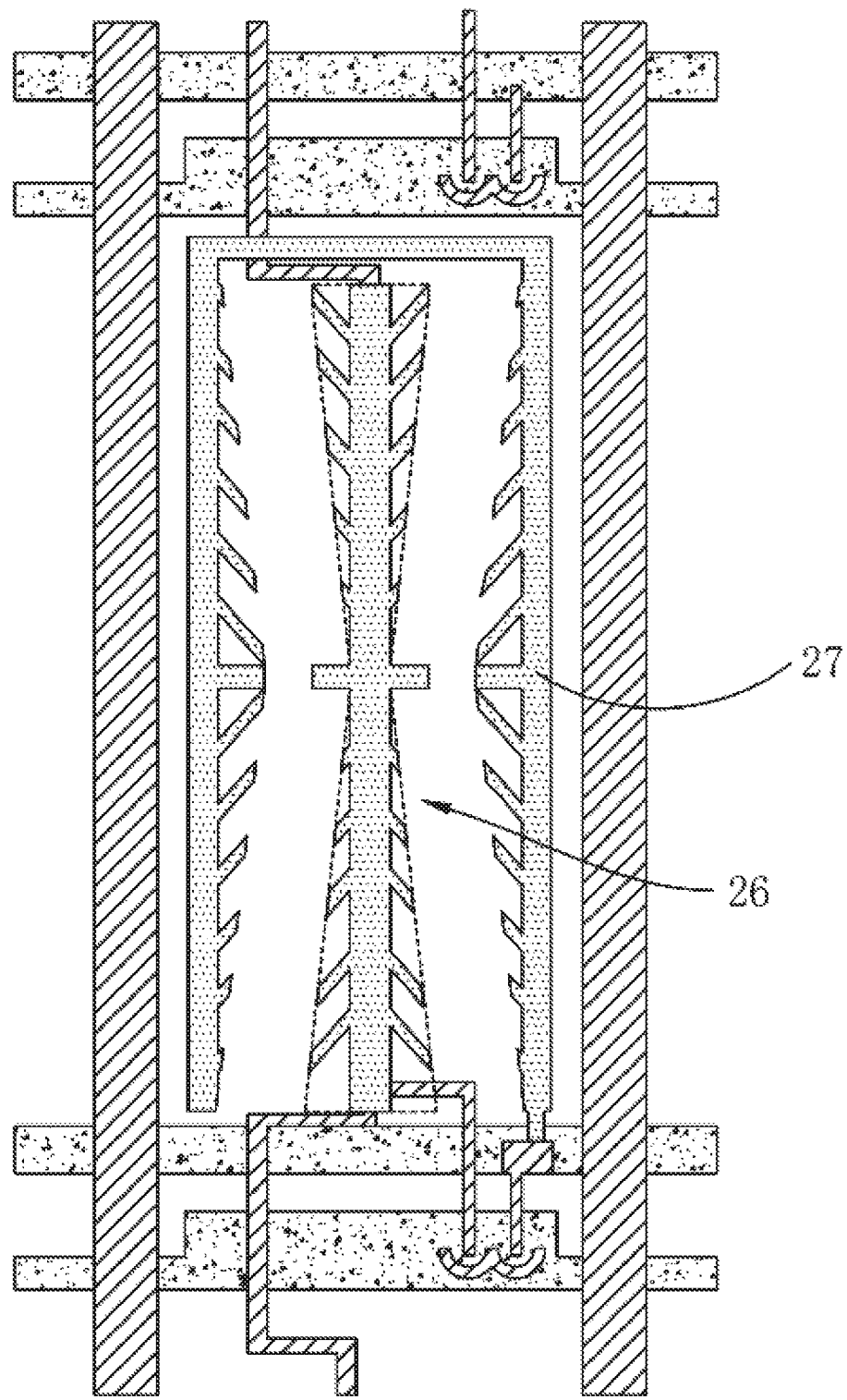
Figure 6:
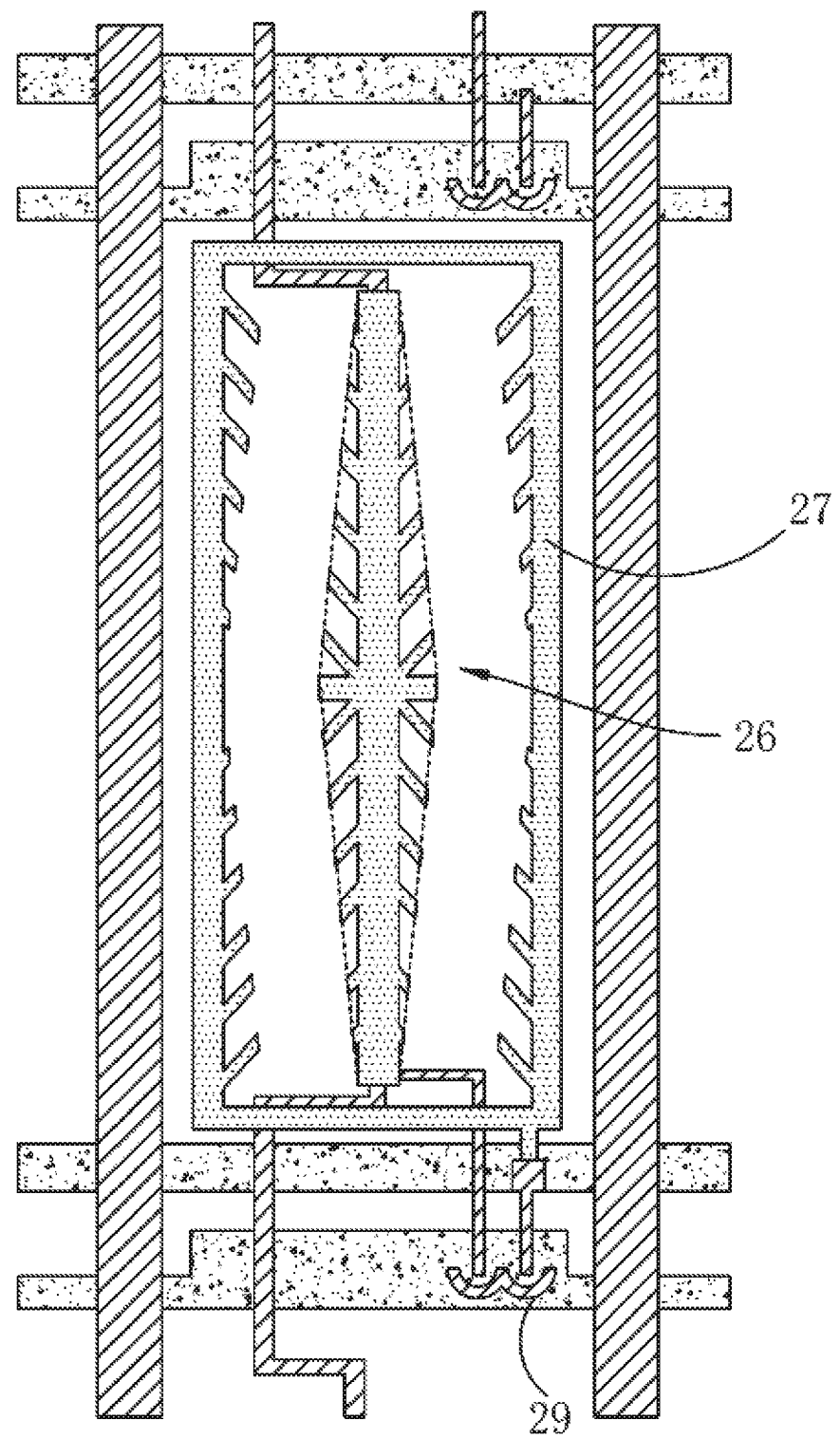
FIGS. 6 and 7 are schematic structural views of the array substrate of a fourth embodiment of the present invention.

A shape of the primary pixel electrode 26 (the shape depicted by broken lines in FIGS. 4 to 7) as a whole can be rectangular (with reference to FIG. 4), hourglass-shaped (with reference to FIG. 5), or spindle-shaped (with reference to FIG. 6).

By designing shapes and graphic ratios of the primary pixel electrode 26 and the secondary pixel electrode 27, diversity of liquid crystal molecules can be enhanced to improve the characteristic of angle of view and the response time.

In a third embodiment, with reference to FIGS. 4 and 5, the two splitting bodies are disposed at an interval.

In a fourth embodiment, with reference to FIGS. 6 and 7, the two splitting bodies are connected to each other. The secondary pixel electrode 27 is a closed loop as a whole, the primary pixel electrode 26 is located in the closed loop defined by the secondary pixel electrode 27.

It should be understood that when the secondary pixel electrode 27 forms a closed loop as a whole, the source and drain electrode 29 can extend to a position right under the primary pixel electrode 26 to achieve electrical connection between the primary pixel electrode 26 and the source and drain electrode 29 through via holes to prevent shorting between the secondary pixel electrode 27 and the primary pixel electrode 26.

Figure 8:
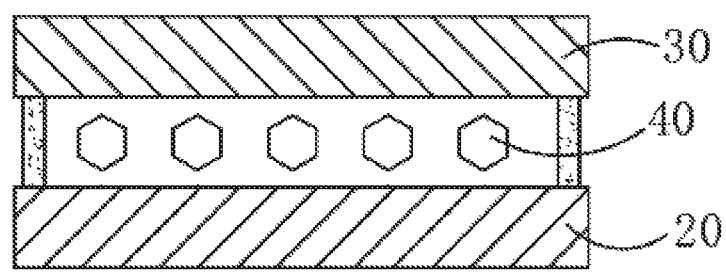
FIG. 8 is a schematic structural view of a display panel of an embodiment of the present invention.

Based on the above array substrate 20, the present invention also provides a display panel, with reference to FIG. 8, the display panel comprises a color filter substrate 30 and the array substrate 20 as described in any one of the above embodiments, and a liquid crystal layer 40 is disposed between the color filter substrate 30 and the array substrate 20.

Advantages of the present invention: by the secondary pixel electrode 27 surrounding the portion of the primary pixel electrode 26 near the data lines 23, the secondary pixel electrode 27 is used to interference between the primary pixel electrode 26 and the data lines 23 and prevent coupling capacitors from being formed among the data lines 23 and the primary pixel electrode 26. Therefore, the design of a metal mask layer can be cancelled under a precondition of prevention of crosstalk issue such that an aperture ratio and a transmittance of the array substrate 20 can be improved drastically.

In the above-mentioned embodiments, the descriptions of the various embodiments are focused. For the details of the embodiments not described, reference may be made to the related descriptions of the other embodiments.

What is claimed is:

1. An array substrate, comprising:
   an underlay substrate;
   a plurality of scan lines disposed transversely on the underlay substrate and arranged abreast;
   a plurality of data lines disposed longitudinally on the underlay substrate and arranged abreast; and
   a plurality of pixel units disposed on the underlay substrate and distributed in an array, each of the scan lines corresponding to a row of the pixel units, each of the data lines corresponding to a column of the pixel units, and adjacent two of the data lines defining a boundary of the pixel units;
   wherein each of the pixel units comprises a primary region and a secondary region, the pixel unit comprises a primary pixel electrode located in the primary region and a secondary pixel electrode located in the secondary region, the primary pixel electrode and the secondary pixel electrode are disposed at an interval, the secondary pixel electrode surrounds a portion of the primary pixel electrode near the data lines;
   wherein the primary pixel electrode comprises a primary electrode, the primary electrode defines a zone in which the primary pixel electrode is located as a plurality of primary domains, a branching electrode is disposed in each of the primary domains and is connected electrically to the primary electrode; the secondary pixel electrode comprises an electrode trunk, the electrode trunk defines a zone in which the secondary pixel electrode is located as a plurality of secondary domains, an electrode branch is disposed in each of the secondary domains and is connected electrically to the electrode trunk;

wherein the primary pixel electrode comprises two third primary electrodes intersecting each other, the third primary electrodes define the zone in which the primary pixel electrode is located as four third primary domains; the secondary pixel electrode comprises two splitting bodies located respectively on two sides of the primary pixel electrode near the data lines, and each of the splitting bodies comprises a third electrode trunk defining the splitting bodies as two third secondary domains.

2. The array substrate as claimed in claim 1, wherein the secondary pixel electrode comprises a first splitting body and two second splitting bodies disposed respectively on two sides of the first splitting body near the data lines, and the second splitting bodies extend along a length direction of the data lines; a mask area is defined among the first splitting body and the second splitting bodies, and the secondary pixel electrode is located in the mask area.

3. The array substrate as claimed in claim 2, wherein the primary pixel electrode comprises a first primary electrode and two branch portions disposed at an interval, the first primary electrode defines a zone in which each of the branch portions is located as two first primary domains, and a first branching electrode is disposed in each of the first primary domains and is connected electrically to the first primary electrode.

4. The array substrate as claimed in claim 2, wherein the first splitting body comprises two first electrode trunks intersecting each other, the first primary electrode defines a zone in which the first splitting body is located as four first secondary domains, and a first branching electrode is disposed in each of the first primary domains and is connected electrically to the first primary electrode.

5. The array substrate as claimed in claim 4, wherein the second splitting bodies comprise two splitting electrodes disposed respectively on two opposite sides of the primary pixel electrode, each of the splitting electrodes comprises a second electrode trunk defining a zone in which the splitting electrodes are located as two second secondary domains, and a second electrode branch is disposed in each of the second secondary domains and is connected electrically to the second electrode trunk.

6. The array substrate as claimed in claim 2, wherein the primary pixel electrode comprises two second primary electrodes intersecting each other, the second primary electrodes defines the zone in which the primary pixel electrode is located as four second primary domains, and a second branching electrode is disposed in each of the second primary domains and is connected electrically to the second primary electrodes.

7. The array substrate as claimed in claim 1, wherein the two splitting bodies are disposed at an interval.

8. The array substrate as claimed in claim 1, wherein the two splitting bodies are connected to each other, the secondary pixel electrode is a closed loop as a whole, and the primary pixel electrode is located in the closed loop defined by the secondary pixel electrode.

9. The array substrate as claimed in claim 1, wherein the data lines comprises a first side disposed near the secondary pixel electrode, an orthographic projection of the secondary pixel electrode on the underlay substrate covers an orthographic projection of the first side on the underlay substrate.

10. The array substrate as claimed in claim 1, wherein the array substrate further comprises a common electrode disposed in a same layer with the scan lines, an orthographic projection of the branching electrode and the electrode branch on the underlay substrate does not coincide with an orthographic projection of the common electrode on the underlay substrate.

11. The array substrate as claimed in claim 1, wherein the branching electrode is disposed obliquely, and an edge line of the branching electrode and an edge line of the primary electrode form a first included angle; the electrode branch is disposed obliquely, and an edge line of the electrode branch and an edge line of the electrode trunk form a second included angle, and each of the first included angle and the second included angle is 10-80 degrees.

12. A display panel, wherein the display panel comprises a color filter substrate and an array substrate, a liquid crystal layer is disposed between the color filter substrate and the array substrate, and the array substrate comprises:
an underlay substrate;
a plurality of scan lines disposed transversely on the underlay substrate and arranged abreast;
a plurality of data lines disposed longitudinally on the underlay substrate and arranged abreast; and
a plurality of pixel units disposed on the underlay substrate and distributed in an array, each of the scan lines corresponding to a row of the pixel units, each of the data lines corresponding to a column of the pixel units, and adjacent two of the data lines defining a boundary of the pixel units;
wherein each of the pixel units comprises a primary region and a secondary region, the pixel unit comprises a primary pixel electrode located in the primary region and a secondary pixel electrode located in the secondary region, the primary pixel electrode and the secondary pixel electrode are disposed at an interval, the secondary pixel electrode surrounds a portion of the primary pixel electrode near the data lines;
wherein the primary pixel electrode comprises a primary electrode, the primary electrode defines a zone in which the primary pixel electrode is located as a plurality of primary domains, a branching electrode is disposed in each of the primary domains and is connected electrically to the primary electrode; the secondary pixel electrode comprises an electrode trunk, the electrode trunk defines a zone in which the secondary pixel electrode is located as a plurality of secondary domains, an electrode branch is disposed in each of the secondary domains and is connected electrically to the electrode trunk;
wherein the secondary pixel electrode comprises a first splitting body and two second splitting bodies disposed respectively on two sides of the first splitting body near the data lines, and the second splitting bodies extend along a length direction of the data lines; a mask area is defined among the first splitting body and the second splitting bodies, and the secondary pixel electrode is located in the mask area;
wherein the first splitting body comprises two first electrode trunks intersecting each other, the first primary electrode defines a zone in which the first splitting body is located as four first secondary domains, and a first branching electrode is disposed in each of the first primary domains and is connected electrically to the first primary electrode;

wherein the second splitting bodies comprise two splitting electrodes disposed respectively on two opposite sides of the primary pixel electrode, each of the splitting electrodes comprises a second electrode trunk defining a zone in which the splitting electrodes are located as two second secondary domains, and a second electrode branch is disposed in each of the second secondary domains and is connected electrically to the second electrode trunk.

13. The display panel as claimed in claim 12, wherein the primary pixel electrode comprises a first primary electrode and two branch portions disposed at an interval, the first primary electrode defines a zone in which each of the branch portions is located as two first primary domains, and a first branching electrode is disposed in each of the first primary domains and is connected electrically to the first primary electrode.

14. The display panel as claimed in claim 12, wherein the primary pixel electrode comprises two second primary electrodes intersecting each other, the second primary electrodes defines the zone in which the primary pixel electrode is located as four second primary domains, and a second branching electrode is disposed in each of the second primary domains and is connected electrically to the second primary electrodes.

* * * * *

UNITED STATES PATENT AND TRADEMARK OFFICE
CERTIFICATE OF CORRECTION

| | |
|---|---|
| PATENT NO. | : 11,281,055 B2 |
| APPLICATION NO. | : 16/627349 |
| DATED | : March 22, 2022 |
| INVENTOR(S) | : Wu Cao et al. |

It is certified that error appears in the above-identified patent and that said Letters Patent is hereby corrected as shown below:

On the Title Page

Item (73) Assignee:
"Shenzhen China Star Optoelectronies Semiconductor Display Technology Co., Ltd."
Should be changed to:
--Shenzhen China Star Optoelectronics Semiconductor Display Technology Co., Ltd.--

Signed and Sealed this
Sixth Day of December, 2022

Katherine Kelly Vidal
*Director of the United States Patent and Trademark Office*